United States Patent [19]

Matsuzawa et al.

[11] Patent Number: 4,536,421
[45] Date of Patent: Aug. 20, 1985

[54] METHOD OF FORMING A MICROSCOPIC PATTERN

[75] Inventors: Toshiharu Matsuzawa, Higashimurayama; Kikuo Douta, Hachioji; Takao Iwayanagi; Hiroshi Yanazawa, both of Tokyo, all of Japan

[73] Assignee: Hitachi, Ltd., Tokyo, Japan

[21] Appl. No.: 288,481

[22] Filed: Jul. 30, 1981

[30] Foreign Application Priority Data

Aug. 1, 1980 [JP] Japan ................... 55-104990

[51] Int. Cl.³ .................... B05D 1/32; C23F 13/00
[52] U.S. Cl. ........................... 427/282; 427/98; 430/194; 430/197; 430/270; 430/313; 430/314; 430/315; 430/319; 430/324; 430/326
[58] Field of Search ............... 430/194, 197, 270, 313, 430/314, 315, 319, 324, 326; 427/98, 282

[56] References Cited

U.S. PATENT DOCUMENTS

| 4,115,120 | 9/1978 | Dyer et al. | 430/315 |
| 4,148,655 | 4/1979 | Itoh et al. | 430/270 |
| 4,211,834 | 7/1980 | Lapadula et al. | 430/326 |
| 4,212,935 | 7/1980 | Canavello et al. | 430/324 |

OTHER PUBLICATIONS

Iwayanagi et al., J. Electrochem. Soc., vol. 127, No. 12, 12/1980, pp. 2759-2760.
Tsunoda et al., Photo Sci. & Eng., vol. 17, No. 4, 7/1973, pp. 390-393.
Maissel et al., Handbook of Thin Film Technology, McGraw Hill Book Co., New York, ©1970, pp. 7, (32-34).

Primary Examiner—Richard Bueker
Attorney, Agent, or Firm—Antonelli, Terry & Wands

[57] ABSTRACT

A negative photoresist having benzene rings is irradiated with short-wavelength ultraviolet radiation, and is developed to form a photoresist pattern whose sectional shape is an inverted trapezoid. Using the photoresist pattern, the lift-off process having heretofore required troublesome steps can be performed very easily.

17 Claims, 9 Drawing Figures

METHOD OF FORMING A MICROSCOPIC PATTERN

BACKGROUND OF THE INVENTION

1. Field of the Invention

This invention relates to a method of forming a microscopic pattern, and more particularly to a method which can form a microscopic pattern at high precision far more easily than in a prior art by the use of the lift-off process.

2. Description of the Prior Art

With remarkable enhancements in the densities of integration of various semiconductor integrated circuits in recent years, a technique capable of forming a microscopic pattern of very small line width and interval at high precision has increasingly been required.

Heretofore, various patterns of various semiconductor integrated circuits have generally been formed by a method called photolithography.

As to the photolithography, various processes are performed according to objects to-be-etched or purposes. Among them, the so-called lift-off process has the merit of being capable of forming the microscopic pattern at high precision. Therefore, it is extensively used for the formation of the interconnections of various semiconductor integrated circuits, etc.

An example of the steps of the lift-off process is illustrated in FIGS. 1(a)–1(e). First, as shown in FIG. 1(a), on the surface of a silicon substrate, an insulating film or the like 1 on which a microscopic pattern is to be formed, first and second photoresist films 2 and 3 whose solubilities for a developer are different from each other are deposited into stacked layers (the first photoresist film 2 can be replaced with a film of a material other than a photoresist).

The second photoresist film 3 is selectively exposed to light through a mask, and is developed to remove desired parts of the second photoresist film 3 as shown in FIG. 1(b). Since the developer used in this case does not dissolve the first photoresist film 2, only the desired parts of the second photoresist film are selectively removed.

Subsequently, using a developer which can develop only the first photoresist, the exposed parts of the first photoresist film 2 are removed. In this case, the developing is conducted somewhat excessively to cause the side etching, so that overhangs owing to the second photoresist film 3 are formed as shown in FIG. 1(c).

A material to form the microscopic pattern, for example, aluminum is deposited on the whole surface by the vacuum evaporation or the like.

Since, however, the overhangs of the second photoresist film 3 are formed, the evaporated aluminum does not reach the rear sides of the overhangs with the result that the deposited aluminum film 4 is separately deposited on the substrate 1 and the second photoresist film 3 without becoming a continous film as seen from FIG. 1(d).

Subsequently, the first photoresist film 2 is removed along with the second photoresist film 3 and the aluminum film 4 deposited thereon. Then, only the aluminum film 4 deposited directly on the substrate 1 remains, and the pattern of the aluminum is formed.

Although the lift-off process has the advantage of being capable of forming the microscopic pattern precisely, it is very complicated in practical use because it must stack and deposit the two sorts of photoresist films and carry out the developings twice as described above. A simpler method has been eagerly desired.

SUMMARY OF THE INVENTION

An object of this invention is to solve the problem of the prior art and to provide a microscopic-pattern forming method which can form a microscopic pattern at high precision and with extraordinary ease.

Another object of this invention is to provide a lift-off process of very easy operations which may use only one kind of photoresist film and carry out developing only once.

In order to accomplish the objects, according to this invention, a photoresist film which absorbs short-wavelength ultraviolet radiation (ultraviolet radiation whose wavelengths are approximately 200–320 nm shall be written the "short-wavelength ultraviolet radiation" in this specification) very much is irradiated with the short-wavelength ultraviolet radiation and is developed, thereby to form a photoresist pattern whose sectional shape is an inverted trapezoid and which is used for the lift-off operation.

DETAILED DESCRIPTION OF THE PREFERRED EMBODIMENTS

Hereunder, this invention will be described in detail.

As stated before, the prior-art lift-off process has employed two kinds of photoresist or resin films or the likes whose solubilities for a developer are different, and it has required such complicated steps as developing or dissolving them twice.

This is because "overhangs" are formed so that a metal film to be left and a metal film to be removed may be formed separately without continuing.

Figure 1A:
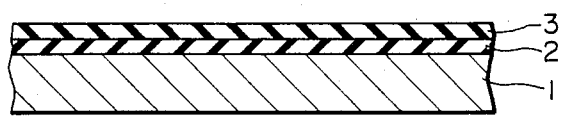
FIGS. 1(a)–1(e) are flow diagrams showing a prior-art lift-off process.
Figure 1B:
Figure 1C:
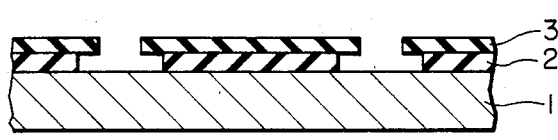
Figure 1D:
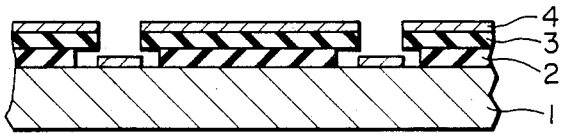
Figure 1E:
Figure 2:
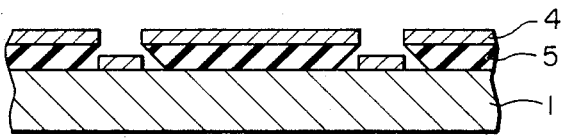
FIG. 2 is a sectional view for explaining this invention.

Referring to FIG. 2, when a photoresist pattern 5 having a sectional shape of an inverted trapezoid which has an upper side greater than a lower side is formed and a film 4 of a material (e.g., metal) to form a microscopic pattern is thereafter formed from above by, e.g., the vacuum evaporation, the material does not enter under the inverted-trapezoidal photoresist pattern 5. The produced metal film 4 therefore becomes separate without continuing as seen from FIG. 2.

Accordingly, by subsequently removing the photoresist film 5 along with the overlying metal film 4, the metal film 4 can be left only on a substrate 1, and the microscopic pattern made of the metal film 4 is formed.

In other words, it has heretofore been impossible to form such photoresist pattern having the inverted-trapezoidal sectional shape, and hence, the overhangs have been formed by employing the two sorts of photoresist films or the likes of the different solubilities and performing the developings twice.

This invention uses as a negative photoresist a polymer which has a benzene ring or a photoresist which is formed by adding a certain aromatic azide to the polymer, whereby the photoresist pattern having the inverted-tradezoidal sectional shape is formed without using two kinds of photoresists, polymers or the likes and by only one developing operation, and it is permitted to perform the lift-off process very easily.

More specifically, when a photoresist which contains a high polymer having a benzene ring, for example, poly-p-vinyl phenol is irradiated with the short-wavelength ultraviolet radiation, a photochemical reaction takes place to lower the solubility of the irradiated part, and the photoresist exhibits properties as a negative photoresist.

Herein, the benzene ring which the photoresist contains absorbs the short-wavelength ultraviolet radiation very well.

Figure 3:
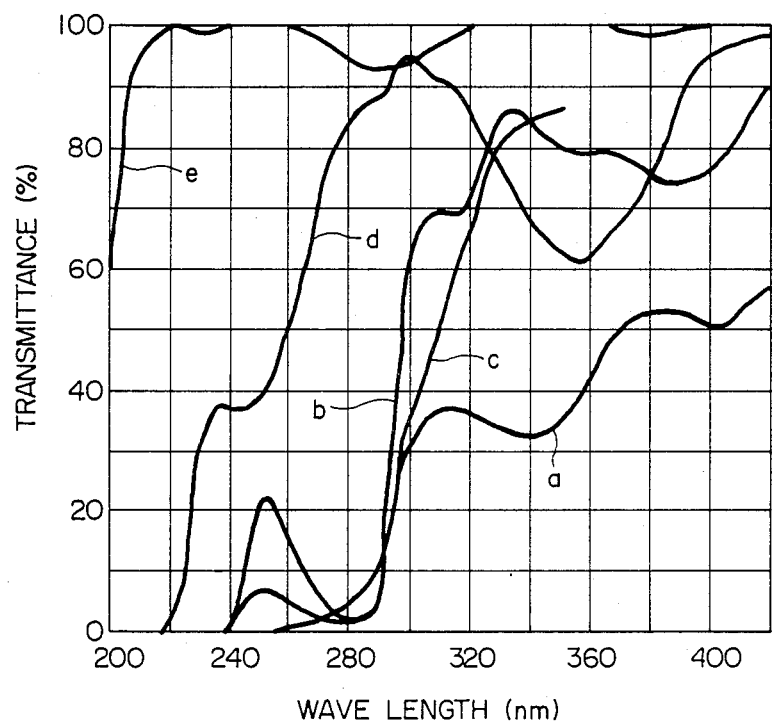
FIG. 3 is a diagram of curves showing the relationships between the transmittances of various photoresists and the wavelengths of irradiating radiation.

By way of example, FIG. 3 illustrates the relationships between the wavelength of ultraviolet radiation and the transmittance in the case where various photoresist films were irradiated with the ultraviolet radiation. As indicated by curves a, b and c in FIG. 3, all of photoresists AZ1350J and AZ2400 (both being trade names) which have benzene rings and a resist in which a sensitizer is added to poly-p-vinyl phenol absorb the short-wavelength ultraviolet radiation of wavelengths of and below approximately 320 nm very strongly. In contrast, as indicated by curves d and e, photoresists OMR-84 (trade name) and ODUR1010 (trade name, poly(methyl isopropenyl ketone)) which contain no benzene ring do not possess such feature.

Accordingly, when the photoresist film having the benzene ring is irradiated with the short-wavelength ultraviolet radiation, the attenuation of the irradiating radiation in the thickness direction is very great owing to the extraordinarily great absorption by the photoresist. As a result, only a surface layer of the film is perfectly insolubilized, and a deeper part thereof is less insolubilized and comes to have a higher solubility.

When the photoresist film is developed under such state, the surface layer of the irradiated area does not dissolve because it is perfectly insolubilized. Since, however, the solubility gradually increases in the lower layer as described above, the unreacted part underlying the irradiated area is gradually removed with the proceeding of the developing. Thus, the photoresist pattern 5 having the inverted-trapezoidal sectional shape is formed as shown in FIG. 2.

The sectional shape of the photoresist pattern, i.e., the length of the lower side of the photoresist pattern can be controlled as desired by the developing processing.

For example, when the concentration of a developer is raised, the lower layer is conspicuously etched and the length of the lower side decreases. In case of holding the concentration of the developer constant, the length of the lower side becomes smaller as the developing time is longer.

The photoresist usable in this invention needs to satisfy the two conditions that it contains the benzene ring and well absorbs the short-wavelength ultraviolet radiation of the wavelengths of and below approximately 320 nm, and that it can form a sharp microscopic pattern.

As the photoresist fulfilling such conditions, there can be employed a polymer which has phenolic hydroxyl groups or the polymer to which a certain kind of aromatic azide is added.

Usable as such polymers are, for example, poly(vinyl phenol), addition condensation products between phenols or cresols and formaldehyde (the so-called novolac resins), bromides of poly(vinyl phenol), poly(vinyl hydroxybenzoate) or poly(vinyl hydroxybenzal), and poly(isopropenyl phenol).

In order to achieve a high resolution, the aforecited azide needs to exhibit a great absorption for the short-wavelength ultraviolet radiation and to have no great absorption in a region of longer wavelengths. Azides which have a structure indicated by the following general formula (1) are preferable in practical use:

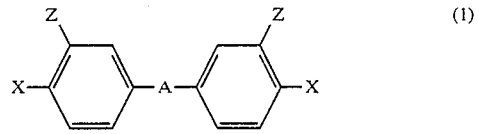

Here, letter A denotes an element or substituent unconjugate with two benzene rings, such as O, S, CH$_2$, CH$_2$CH$_2$, SO$_2$ and S$_2$, letter X denotes H or N$_3$, and letter Z denotes a substituent N$_3$ when X is H and an element H or Cl when X is N$_3$.

Several examples of the azides which meet the above conditions are listed in Table 1.

TABLE 1

| Designation | Structural formula | Peak absorption wavelength (nm) |
|---|---|---|
| 4,4'-diazidephenylsulfide | N$_3$—⟨⟩—S—⟨⟩—N$_3$ | 273 |
| 4,4'-diazidephenylsulfone | N$_3$—⟨⟩—SO$_2$—⟨⟩—N$_3$ | 284 |
| 3,3'-diazidephenylsulfone | N$_3$—⟨⟩—SO$_2$—⟨⟩—N$_3$ | 240 |

TABLE 1-continued

| Designation | Structural formula | Peak absorption wavelength (nm) |
|---|---|---|
| 4,4'-diazidediphenylmethane | $N_3-\langle\!\!\!\bigcirc\!\!\!\rangle-CH_2-\langle\!\!\!\bigcirc\!\!\!\rangle-N_3$ | 256 |
| 3,3'-dichloro-4,4'-diazidediphenyl-methane | $N_3-\langle\!\!\!\bigcirc\!\!\!\rangle(Cl)-CH_2-\langle\!\!\!\bigcirc\!\!\!\rangle(Cl)-N_3$ | 258 |
| 4,4'-diazidephenylether | $N_3-\langle\!\!\!\bigcirc\!\!\!\rangle-O-\langle\!\!\!\bigcirc\!\!\!\rangle-N_3$ | 264 |
| 4,4'-diazidediphenyldisulfide | $N_3-\langle\!\!\!\bigcirc\!\!\!\rangle-S-S-\langle\!\!\!\bigcirc\!\!\!\rangle-N_3$ | 266 |
| 4,4'-diazidebibenzyl | $N_3-\langle\!\!\!\bigcirc\!\!\!\rangle-CH_2-CH_2-\langle\!\!\!\bigcirc\!\!\!\rangle-N_3$ | 254 |

As the photoresists formed by combining the azides and the polymers, there can be employed, for example, one in which the novolac resin of the type of the copolymerization between phenol and m-cresol has 4,4'-diazidediphenylsulfide added thereto and is dissolved in methyl cellosolve acetate, and one in which poly-p-vinyl phenol and 3,3'-diazidediphenylsulfone are dissolved in methyl cellosolve acetate.

In addition to them, there can be used various AZ type photoresists in which naphthoquinone diazide etc. are added as sensitizers to a phenol novolac type polymer, such as AZ1350J and AZ2400 (both being trade names) produced by Shipley Inc., and commercially-available positive films which have compositions similar to those of the AZ type photoresists, for example, OFPR-77 (produced by Tokyo Ohka, trade name) and HPR-204 (produced by Hunt Chemical, trade name).

Usable as the developer in this invention are, for example, alkaline aqueous solutions which are obtained by dissolving sodium hydroxide, potassium hydroxide, sodium phosphate, sodium silicate, tetramethylammonium hydroxide, etc. in water. Further, organic solvents which include an ester type organic solvent such as isoamyl acetate and a ketone type organic solvent such as methyl isobutyl ketone can be employed as the developer.

As is well known, the existence of sodium or potassium ions is very unfavorable for the formation of semiconductor devices. In applying this invention to the semiconductor device manufacture, therefore, it is preferable to select a developer which contains neither sodium nor potassium.

However, in case of employing this invention for the manufacture of magnetic bubble memory devices, the existence of sodium and potassium does not form any obstacle at all. It is therefore allowed to use a developer containing sodium or potassium, such as sodium hydroxide or potassium hydroxide.

While the liquid temperatures and developing times of the developers are, of course, conspicuously different depending upon many factors including the kind of the developer used, the kind and film thickness of the photoresist, etc., they are approximately 10°–40° C. and approximately 10–600 seconds respectively. The concentrations of the developers are approximately 0.1–10 weight-%.

While the film thicknesses of the photoresists are different according to the kind of the photoresist used, the purpose, etc., they are selected in a range of approximately 0.5–3 μm.

The quantities of exposure of the photoresist films are properly selected depending upon the kind of the photoresist and the sectional shape of the photoresist pattern to be formed. In this regard, however, in case where the AZ type photoresists produced by Shipley Inc., etc. are used, they exhibit properties as positive photoresists with small quantities of exposure and cannot be used in this invention. Therefore, they must be subjected to an exposure of at least 300 mJ/cm$^2$ (a value at a wavelength of 254 nm, the same applying hereinbelow) so as to exhibit characteristics as negative photoresists.

In general, the quantity of exposure is selected from within a range of approximately 5–1,000 mJ/cm$^2$, and the exposure time is approximately 5–500 seconds.

EXAMPLE 1

20 gr. of poly-p-vinyl phenol (produced by Maruzen Oil Co., trade name: Maruzen Jushi M) was dissolved in 80 gr. of methyl cellosolve acetate, to prepare a photoresist solution.

The photoresist solution was applied on a silicon wafer by the spin coating, to form a photoresist film 0.9 μm thick.

Using an Xe-Hg lamp of an output of 1 kW as a light source, the photoresist film was exposed to light through a chromium mask formed on a quartz substrate. The light intensity at the wavelength of 254 nm was 5.5 mW/cm$^2$, and the exposure time was 100 seconds.

The photoresist film exposed to the light was developed with a 4% aqueous solution of tetramethylammonium hydroxide for 90 seconds. Then, striped photoresist patterns whose sectional shape was an inverted trapezoid with its upper side and its lower side being about 4.5 μm and 3.5 μm long respectively were obtained.

An aluminum film 0.5 μm thick was deposited as shown in FIG. 2 by the vacuum evaporation. Thereafter, the resultant silicon wafer was immersed in acetone, and the photoresist patterns were removed along with the aluminum film deposited thereon. Then, striped aluminum patterns having a line width of 2.0 μm were formed on the silicone wafer at a good precision.

EXAMPLE 2

20 gr. of the novolac resin of the type of the copolymerization between phenol and m-cresol and 4 gr. of 4,4'-diazidephenyldisulfide were dissolved in 80 gr. of methyl cellosolve acetate, to prepare a photoresist solution.

The photoresist solution was applied on a silicon wafer by the spin coating, to form a photoresist film 0.9 μm thick.

Using an Xe-Hg lamp of an output of 1 kW as a light source, the photoresist film was exposed to light through a chromium mask formed on a quartz substrate. The light intensity at the wavelength of 254 nm was 5.5 mW/cm$^2$, and the exposure time was 2 seconds.

As in Example 1, the photoresist film was developed with a 4% aqueous solution of tetramethylammonium hydroxide.

Figure 4A:
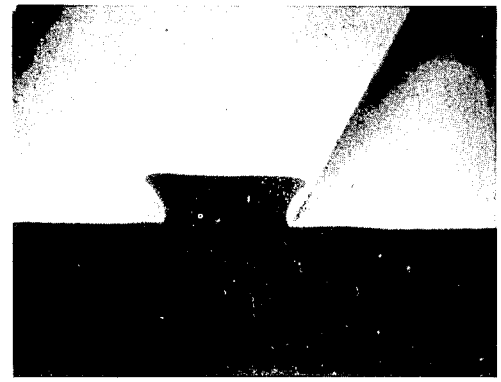
FIGS. 4(a)–4(b) are microphotographs taken with a scanning electron microscope, showing the sectional shapes of photoresist patterns formed by this invention.
Figure 4B:
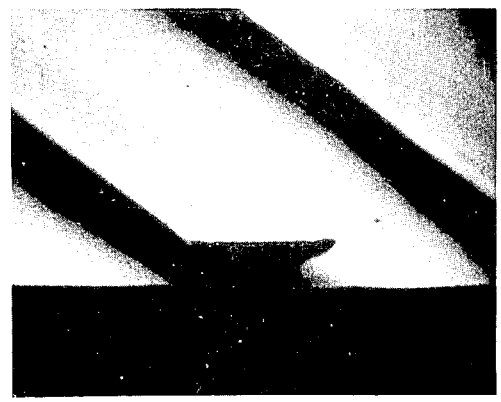

FIGS. 4(a) and 4(b) are microphotographs of photoresist patterns taken with a scanning electron microscope by setting developing times at 50 seconds and 60 seconds, respectively.

As apparent from FIGS. 4(a) and 4(b), the width of a lower side is much smaller in the photoresist pattern obtained through the developing for 60 seconds, than in the photoresist pattern obtained through the developing for 50 seconds.

That is, if the other conditions are identical, the width of the lower side of the resist pattern can be controlled by the developing time. Thus, a sectional shape which is the most suitable for performing the lift-off operation can be readily formed.

As set forth above, according to this invention, various microscopic patterns such as interconnections can be formed at high precision by performing the lift-off operation very easily without using two kinds of photoresists or carrying out developings twice and at the same number of steps as in the conventional photolithography.

We claim:

1. A method of forming a microscopic pattern, including:
   (1) the step of depositing a film of a negative photoresist, said photoresist including a polymer having benzene rings, said film being a single layer, on a surface on which the microscopic pattern is to be formed, to form a photoresist film of said single layer,
   (2) the step of irradiating a desired part of said photoresist film with short-wavelength ultraviolet radiation, to lower a solubility of the irradiated part,
   (3) the step of developing said photoresist film, to remove an unirradiated part thereof and to form a photoresist pattern from said photoresist film whose sectional shape is an inverted trapezoid,
   (4) the step of depositing a film of a material which is to form said microscopic pattern on the portion of said surface that is exposed by removal of said unirradiated part and on said photoresist pattern, and
   (5) the step of removing said photoresist pattern along with the film of the material deposited thereon.

2. A method of forming a microscopic pattern as defined in claim 1, wherein said photoresist is selected from the group consisting of poly(vinyl phenol), bromides of poly(vinyl phenol), poly(vinyl hydroxybenzoate), poly(vinyl hydroxybenzal), and addition condensation products between phenols or cresols and formaldehyde.

3. A method of forming a microscopic pattern as defined in claim 1 or 2, wherein said photoresist contains an aromatic azide.

4. A method of forming a microscopic pattern as defined in claim 3, wherein said aromatic azide has a composition which is represented by a general formula:

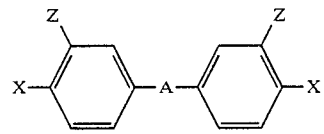

(where letter A denotes an element or substituent unconjugate with two benzene rings, such as O, S, CH$_2$, C$_2$H$_4$, SO$_2$ and S$_2$, letter X denotes H or N$_3$, and letter Z denotes a substituent N$_3$ when X is H and an element H or Cl when X is N$_3$).

5. A method of forming a microscopic pattern as defined in claim 3, wherein said aromatic azide is selected from the group consisting of 4,4'-diazidephenylsulfide, 4,4'-diazidephenylsulfone, 3,3'-diazidephenylsulfone, 4,4'-diazidediphenylmethane, 3,3'-dichloro-4,4'-diazidediphenyl-methane, 4,4'-diazidephenylether, 4,4'-diazidediphenyldisulfide, and 4,4'-diazidebibenzyl.

6. A method of forming a microscopic pattern as defined in claim 1, wherein the photoresist film has a thickness of 0.5–3 μm.

7. A method of forming a microscopic pattern as defined in claim 1, wherein in the step of irradiating, the desired part of the photoresist film is exposed to 5–1,000 mJ/cm$^2$ of short-wavelength ultraviolet radiation.

8. A method of forming a microscopic pattern as defined in claim 1 or 7, wherein the step of irradiating is performed for 5–500 seconds.

9. A method of forming a microscopic pattern as defined in claim 1, wherein, in the step of developing the photoresist film, the film is contacted with a developer selected from the group consisting of an aqueous solution of sodium hydroxide, potassium hydroxide, sodium phosphate, sodium silicate or tetramethylammonium hydroxide, isoamyl acetate and methyl isobutyl ketone.

10. A method of forming a microscopic pattern as defined in claim 9, wherein the developer does not contain sodium or potassium.

11. A method of forming a microscopic pattern as defined in claim 1, wherein said polymer having benzene rings is a polymer having phenolic hydroxyl groups.

12. A method of forming a microscopic pattern as defined in claim 1, wherein said inverted trapezoid shape has a first side nearest to the surface on which the microscopic pattern is to be formed that is shorter than the side opposite to said first surface.

13. A method of forming a microscopic pattern as defined in claim 1 or 12, wherein said negative photoresist is formed directly on said surface on which the microscopic pattern is to be formed.

14. A method of forming a microscopic pattern as defined in claim 13, wherein, in depositing the film of a material which is to form the microscopic pattern, discontinuities between the material for forming the microscopic pattern deposited on the photoresist pattern and the material for forming the microscopic pattern deposited on the surface that is exposed by removal of said unirradiated part are formed due to the inverted trapezoid shape of said photoresist pattern, whereby removal of said film deposited on the photoresist pattern together with said photoresist pattern is facilitated.

15. A method of forming a microscopic pattern as defined in claim 1 or 12, wherein, in depositing the film of a material which is to form the microscopic pattern, discontinuities between the material for forming the microscopic pattern deposited on the photoresist pattern and the material for forming the microscopic pattern deposited on the surface that is exposed by removal of said unirradiated part are formed due to the inverted trapezoid shape of said photoresist pattern, whereby removal of said film deposited on the photoresist pattern together with said photoresist pattern is facilitated.

16. A method of forming a microscopic pattern as defined in claim 1 or 12, wherein said material which is to form said microscopic pattern is a metal.

17. A method of forming a microscopic pattern as defined in claim 16, wherein said metal is deposited in step (4) by vacuum evaporation.

* * * * *